(12) United States Patent
Jain

(10) Patent No.: US 7,933,126 B2
(45) Date of Patent: Apr. 26, 2011

(54) SOLID STATE RELAY WITH INTERNAL HEAT SINK

(75) Inventor: Dipin Jain, Palatine, IL (US)

(73) Assignee: Schneider Electric USA, Inc., Palatine, IL (US)

( * ) Notice: Subject to any disclaimer, the term of this patent is extended or adjusted under 35 U.S.C. 154(b) by 0 days.

(21) Appl. No.: 12/381,384

(22) Filed: Mar. 11, 2009

(65) Prior Publication Data

US 2010/0232114 A1 Sep. 16, 2010

(51) Int. Cl.
H05K 7/20 (2006.01)
H01L 23/34 (2006.01)

(52) U.S. Cl. ........ 361/704; 361/676; 361/690; 361/707; 361/714; 361/717; 165/185; 174/16.3; 174/526; 174/547; 174/548; 335/202

(58) Field of Classification Search .......... 361/676–678, 361/690, 704, 707, 714, 717; 165/80.2–80.3, 165/85, 185; 335/202; 174/16.3, 521, 547–548
See application file for complete search history.

(56) References Cited

U.S. PATENT DOCUMENTS

| | | | |
|---|---|---|---|
| 4,172,272 A * | 10/1979 | Schneider | 361/717 |
| 4,336,568 A | 6/1982 | Mitchell | |
| 4,589,927 A * | 5/1986 | Allen et al. | 134/25.1 |
| 5,018,050 A * | 5/1991 | Maenishi et al. | 361/717 |
| 5,138,521 A * | 8/1992 | Watanabe et al. | 361/703 |
| 5,170,322 A * | 12/1992 | von Guttenberg | 361/704 |
| 5,276,418 A * | 1/1994 | Klosowiak et al. | 335/202 |
| 6,075,701 A | 6/2000 | Ali | |
| 6,473,304 B1 | 10/2002 | Stevens | |
| 6,563,710 B1 * | 5/2003 | Okuda et al. | 361/704 |
| 6,597,570 B1 * | 7/2003 | Jung et al. | 361/695 |
| 7,165,602 B2 * | 1/2007 | Wang | 165/80.2 |
| 7,403,395 B2 * | 7/2008 | Fujimoto et al. | 361/707 |
| 7,561,430 B2 * | 7/2009 | Tiedemann et al. | 361/719 |
| 2003/0174471 A1* | 9/2003 | Tonello et al. | 361/728 |
| 2005/0086797 A1 | 4/2005 | Popescu | |
| 2006/0120054 A1* | 6/2006 | Buschke | 361/707 |
| 2007/0063339 A1* | 3/2007 | Yao | 257/720 |
| 2008/0101026 A1* | 5/2008 | Ali | 361/708 |

FOREIGN PATENT DOCUMENTS

| | | | | |
|---|---|---|---|---|
| JP | 02163993 A | * | 6/1990 | |
| JP | 02163994 A | * | 6/1990 | |
| JP | 02163995 A | * | 6/1990 | |
| JP | 11224993 A | * | 8/1999 | |
| JP | 2000252659 A | * | 9/2000 | |

OTHER PUBLICATIONS

English translation of Tateishi, JP 02-163994 (Jun. 25, 1990), translated May 2010.*
English translation of Matsunaga, JP 2000-252659 (Sep. 14, 2000), translated Oct. 11, 2010.*

* cited by examiner

Primary Examiner — Jayprakash N Gandhi
Assistant Examiner — Robert J Hoffberg

(57) ABSTRACT

A solid state relay having an internal heat sink for dissipating heat produced by a solid state switching device. The relay being enclosed within a nonmetallic housing and mountable on a DIN type rail system.

17 Claims, 3 Drawing Sheets

SOLID STATE RELAY WITH INTERNAL HEAT SINK

CROSS-REFERENCE TO RELATED PATENTS

Not applicable

STATEMENT REGARDING FEDERALLY SPONSORED RESEARCH OR DEVELOPMENT

Not applicable

FIELD OF THE INVENTION

The present invention relates to relays and particularly to heat sinks for solid state relays.

BACKGROUND OF THE INVENTION

Relays employing solid state switching device are well know in the industry. However, since solid state switching devices switch current electronically they can produce a significant amount of heat. This is particularly true when currents in the range of 10 to 20 Amperes or higher must be switched. Therefore, it is common practice to provide a means for dissipating the heat produced from switching these currents. This has been accomplished by attaching large external heat sinks to the relay housing or by attaching the relay housing directly to the surface of a metallic enclosure surrounding the relay and other electronic components such that the enclosure becomes a heat sink for the relay. Both methods require an exposed metallic surface on the relay housing that can be attached to both the solid state switching devices inside the relay housing and the external heat sink.

SUMMARY OF THE INVENTION

The present invention provides a rail mountable solid state relay for use in hazardous locations. The solid state relay has one or more internal heat sinks constructed from low cost, easily manufactured materials having a high thermal conductivity index and sufficient structural stability to withstand the manufacturing process. A printed wiring board supports the relays electronics, including the solid state switching devices, which are positioned such that the heat sink(s) can be easily attached directly to them with a thermal conductive adhesive. The assembled printed wiring board is dropped into a preformed relay housing configured such that the heat sinks are positioned generally parallel to large planer surfaces of the relay housing. The housing is potted with a thermally conductive potting material and the components required for mounting on the rail are snapped onto the relay housing.

BRIEF DESCRIPTION OF THE DRAWINGS

The features of the invention will be more clearly understood from the following detailed description of the invention read together with the drawings in which.

Figure 1:
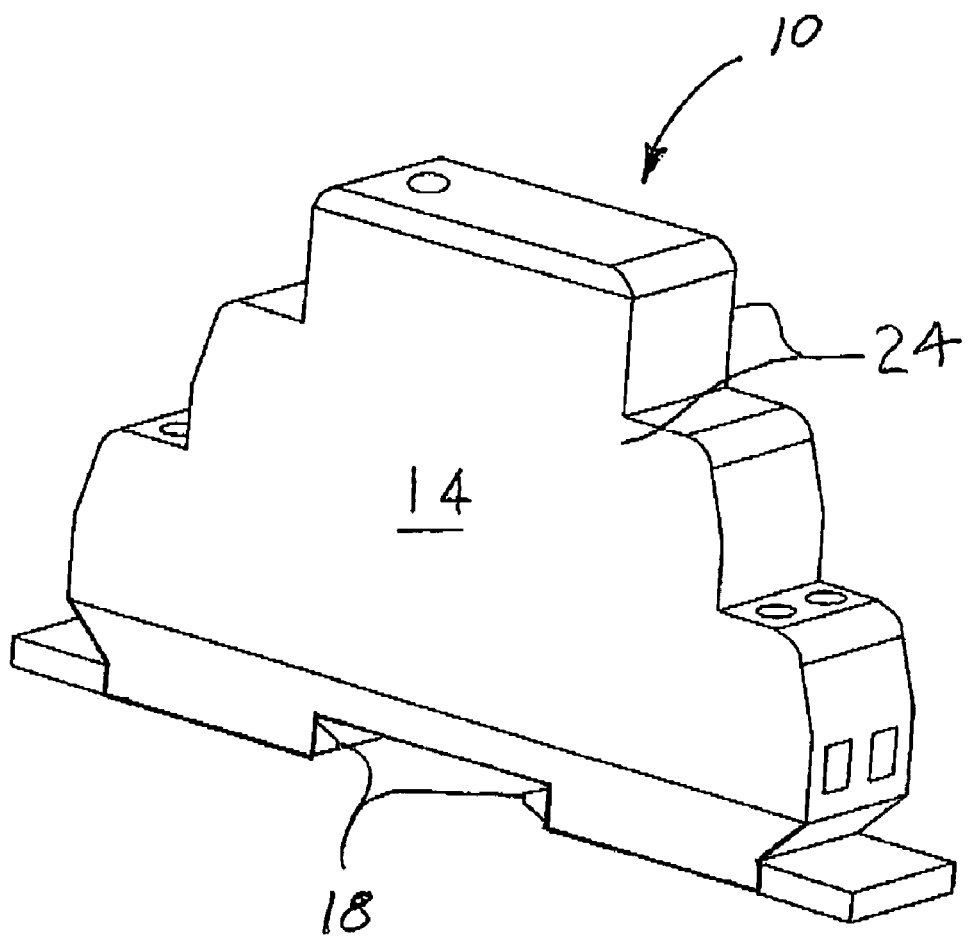
FIG. 1 illustrates a solid state relay constructed in accordance with the present invention.

Before one embodiment of the invention is explained in detail, it is to be understood that the invention is not limited in its application to the details of construction described herein or as illustrated in the drawings. The invention is capable of other embodiments and of being practiced or being carried out in various other ways. Further, it is to be understood that the phraseology and terminology used herein is for the purpose of description and should not be regarded as limiting.

DETAILED DESCRIPTION OF THE DRAWINGS

FIG. 1 illustrates a solid state relay (SSR), generally indicated by reference number 10, constructed in accordance with the present invention. The SSR 10 includes a housing 14 and means 18 for attaching the SSR 10 to a rail support system (not shown), such as a DIN rail or any similar rail system used for mounting electronic equipment. The housing 14 defines a hollow cavity 22 for enclosing the electrical components of the SSR 10 and includes two generally parallel planer surfaces 24, being larger in surface area than other surfaces of the housing 14.

Figure 2:
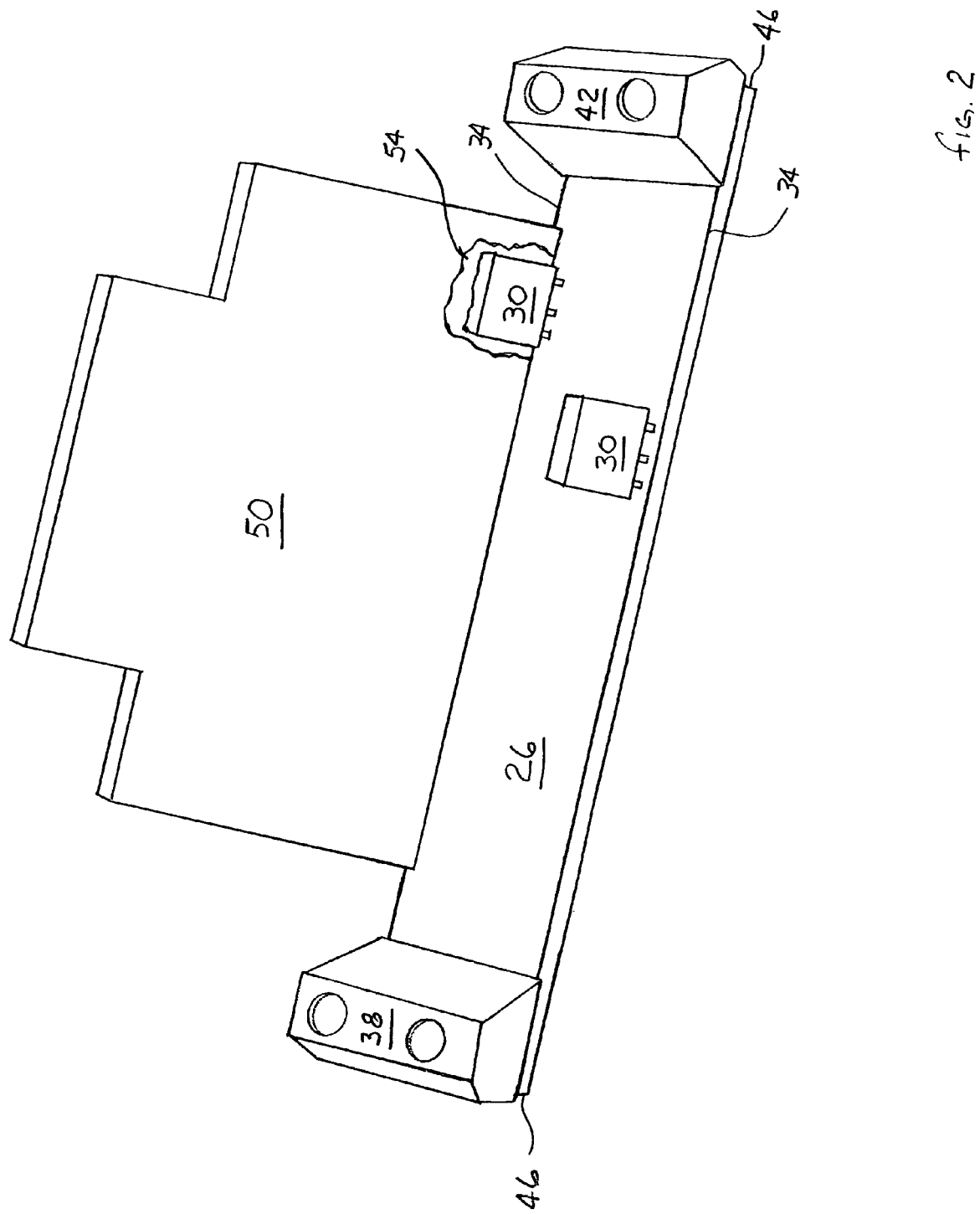
FIG. 2 illustrates a printed wiring board for a solid state relay of FIG. 1, constructed in accordance with the present invention.

FIG. 2 illustrates a printed wiring board (PWB) 26, supporting the electronic components of the SSR 10, including at least one solid state switching device 30 such as a thyristor or similar solid state switching device. When these solid state switching devices 30 switch currents in the 10-20+ amp range significant heat is produced. That heat must be dissipated to prevent potential failure of the SSR 10. The solid state switching devices 30 are positioned adjacent an edge 34 of the PWB 26. The input terminals 38 and output terminals 42 of the SSR 10 are also positioned adjacent edges 46 of the PWB 26. The PWB 26 has at least one heat sink 50 for removing heat produced by the solid state switching devices 30. The at least one heat sink 50 is bonded to the solid state switching device 30 or other major heat producing device by a thermally conductive adhesive 54. The heat sink 50 must have a high thermal conductivity index to dissipate the generated heat and sufficient structural strength to withstand the manufacturing processes required to assemble the SSR 10. Inexpensive, easily manufactured materials such as aluminum, which is commonly used for heat sinking, have the required structural strength but do not have sufficient thermal conductivity to dissipate the heat generated by solid state switches 30 when switching currents in the 10-20+ amp range. Materials having the necessary thermal conductivity to dissipate the generated heat are generally expensive and/or difficult to manufacture or do not have sufficient structural strength to withstand the manufacturing process. The heat sinks 50 of the present invention can be a combination of one structurally sufficient heat sink 50 such as aluminum and one thermally sufficient heat sink 50 such as graphite of similar material having a thermal conductivity index at least 2 times that of aluminum, easily manufactured and inexpensive. It is also understood that a combination of materials such as graphite or similar high thermal conductivity material with aluminum mesh or aluminum perimeter framing can be used to accomplish the required thermal conductivity and structural strength.

Figure 3:
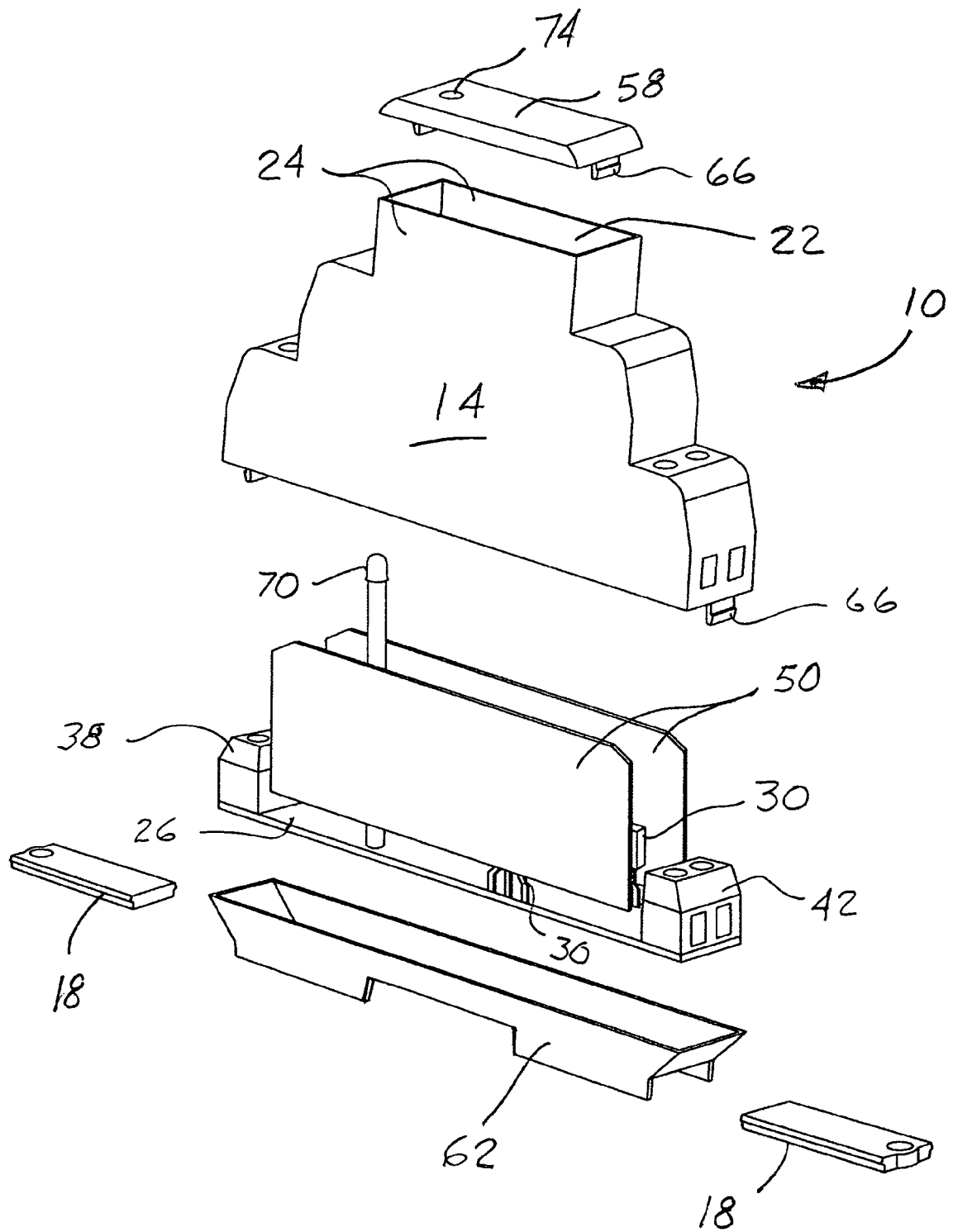
FIG. 3 is an exploded view of the solid state relay housing, printed wiring board, heat sinks and rail attaching means prior to potting the solid state relay.

FIG. 3 illustrates in exploded view the solid state relay housing 14, assembled PWB 26 and rail attaching means 18. The heat sinks 50 are shape to generally conform to the planer surfaces 24 of the SSR housing 14 and sized to be slidably received within the cavity 22 defined by the SSR housing 14. The housing 14 can be made of one piece, as shown in FIG. 1, of several pieces as shown in FIG. 3. The housing 14 of FIG. 3 includes a cap 58 and a bottom 62, which are assembled to the housing 14 by means 66 well known in the art. The bottom 62 includes provisions for receiving the support rail mounting means 18. Also shown in FIG. 3 is a status indicator 70 that can be seen through a window 74 in the cap 58. After sliding the assembled PWB 26 into the housing 14 the cavity 22 of the housing 14 is potted with a thermally conductive potting material as is well known in the industry (not shown). The housing 14 is made from an electrically insulating material such as a polycarbonate. This combined with the solid state switching device 30, internal heat sink 50 and potting material ensure that there are no potential arc producing elements exposed to the surrounding atmosphere and permit the SSR 10 to be classified as acceptable for hazardous locations. The ability to be installed on a rail supporting system permits the device to be installed in a hazardous location without requiring an expensive explosion proof enclosure.

I claim:

1. A solid state relay having an internal heat dissipation device, the relay comprising:
   an electrically nonconductive housing defining a hollow cavity;
   elements having a potential for producing an arc, including but not limited to, a printed wiring board (PWB), electronic components of the solid state relay and the internal heat dissipation device;
   wherein the PWB supports the electronic components of the solid state relay including at least one solid state switching device, the solid state switching device being in thermal communication with at least one heat sink of the internal heat dissipation device, the at least one heat sink being in juxtaposed position with an internal surface of the housing, the housing and a thermally conductive potting material completely enclosing the PWB, the electronic components of the solid state relay and the heat dissipation device within the hollow cavity such that no potentially arc producing elements are exposed to the atmosphere surrounding the housing.

2. The solid state relay of claim 1, wherein the PWB also supports an input terminal and an output terminal.

3. The solid state relay of claim 1, wherein the at least one solid state switching device is located adjacent an edge of said PWB.

4. The solid state relay of claim 1, wherein the at least one heat sink is thermally linked to the at least one solid state switching device by a thermally conductive adhesive.

5. The solid state relay of claim 1, wherein the housing includes two substantially parallel planer surfaces spaced apart by said cavity and combined being larger in surface area than the combined surface area of the other surfaces of the electrically nonconductive housing.

6. The solid state relay of claim 5, wherein the internal surface to which the at least one heat sink is in juxtapose position is one of the substantially parallel planer surfaces of the electrically nonconductive housing.

7. The solid state relay of claim 1, wherein the at least one heat sink is made of aluminum.

8. The solid state relay of claim 1, wherein the at least one heat sink is made of graphite.

9. The solid state relay of claim 1, wherein the heat sink is made of a carbon based material having a thermal conductivity index at least two times greater than the thermal conductivity index of aluminum.

10. The solid state relay of claim 1, wherein the heat sink is a composite of a first material having structural qualities of aluminum and a second material having a thermal conductivity index of graphite.

11. The solid state relay of claim 1, wherein the at least one heat sink includes a first heat sink having a structural strength of aluminum and a second heat sink having a thermal conductivity index of graphite.

12. The solid state relay of claim 11, wherein the first heat sink is in juxtapose position with a first internal surface of the electrically nonconductive housing and the second heat sink is in juxtapose position with a second internal surface of the housing, the first and second internal surfaces being substantially parallel to one another.

13. The solid state relay of claim 1, further including means for mounting on a support rail.

14. A solid state relay having an internal heat dissipation device, the relay comprising:
   an electrically nonconductive housing defining a hollow cavity;
   elements having a potential for producing an arc, including but not limited to, a printed wiring board (PWB), electronic components of the solid state relay and the internal heat dissipation device;
   wherein the PWB supports the electronic components of the solid state relay including at least one solid state switching device, the solid state switching device being in thermal communication with at least one heat sink of the internal heat dissipation device, the at least one heat sink being in juxtaposed position with an internal surface of the housing, the housing completely enclosing the PWB, the heat dissipation device and a thermally conductive potting material within the hollow cavity such that no potting material or potentially arc producing elements of the solid state relay are exposed to the atmosphere surrounding the housing;
   the at least one heat sink having a combination of structural strength and a thermal conductivity index of graphite.

15. The solid state relay of claim 14, wherein the at least one heat sink is composite of aluminum and graphite.

16. A solid state relay having an internal heat dissipation device, the relay comprising:
   an electrically nonconductive housing defining a hollow cavity;
   elements having a potential for producing an arc, including but not limited to, a printed wiring board (PWB), electronic components of the solid state relay and the internal heat dissipation device;
   wherein the PWB supports the electronic components of the solid state relay including at least one solid state switching device, the housing completely enclosing the PWB, the internal heat dissipation device and a thermally conductive potting material within the hollow cavity such that no potting material or potentially arc producing elements of the solid state relay are exposed to the atmosphere surrounding the housing, the housing including two substantially parallel planer surfaces spaced apart by the hollow cavity;
   the internal heat dissipation device includes a first heat sink having structural strength and a thermal conductivity index of aluminum and a second heat sink having a thermal conductivity index at least two times greater than the thermal conductivity index of the first heat sink, the first and second heat sinks each being in thermal communication with at least one of the at least one solid state switching device and each being substantially the same size and shape as the two substantially parallel planer surfaces and in juxtaposed position with an internal surface of the two substantially parallel planer surfaces of said electrically nonconductive housing.

17. The solid state relay of claim 16, wherein the two substantially parallel planer surfaces are larger in combined surface area than the combined surface area of the other surfaces of the electrically nonconductive housing.

* * * * *